United States Patent [19]
Kennedy et al.

[11] Patent Number: 6,035,868
[45] Date of Patent: Mar. 14, 2000

[54] METHOD AND APPARATUS FOR CONTROL OF DEPOSIT BUILD-UP ON AN INNER SURFACE OF A PLASMA PROCESSING CHAMBER

[75] Inventors: William S. Kennedy, Redwood Shores; Albert J. Lamm, Hollister; Thomas E. Wicker, Fremont; Robert A. Maraschin, Cupertino, all of Calif.

[73] Assignee: Lam Research Corporation, Fremont, Calif.

[21] Appl. No.: 08/828,507

[22] Filed: Mar. 31, 1997

[51] Int. Cl.$^7$ .................................................. C25F 3/14
[52] U.S. Cl. ........................ 134/1.1; 216/68; 156/345; 204/192.32; 438/905
[58] Field of Search ................... 216/2, 68; 438/729; 156/345; 118/723 I, 723 IR; 315/111.21, 111.51; 134/1.1

[56] References Cited

U.S. PATENT DOCUMENTS

| | | |
|---|---|---|
| 4,340,462 | 7/1982 | Koch . |
| 4,579,618 | 4/1986 | Celestino et al. . |
| 4,948,458 | 8/1990 | Ogle . |
| 5,198,718 | 3/1993 | Davis et al. . |
| 5,200,232 | 4/1993 | Tappan et al. . |
| 5,226,967 | 7/1993 | Chen et al. . |
| 5,241,245 | 8/1993 | Barnes et al. . |
| 5,262,029 | 11/1993 | Erskine et al. . |
| 5,304,279 | 4/1994 | Coultas et al. . |
| 5,401,350 | 3/1995 | Patrick et al. . |
| 5,464,476 | 11/1995 | Gibb et al. . |
| 5,473,291 | 12/1995 | Brounley . |
| 5,525,159 | 6/1996 | Hama et al. . |
| 5,529,657 | 6/1996 | Ishii ........................................ 156/345 |
| 5,531,834 | 7/1996 | Ishizuka et al. ...................... 118/723 I |
| 5,580,385 | 12/1996 | Paranjpe et al. ..................... 118/723 I |
| 5,587,038 | 12/1996 | Cecchi et al. . |
| 5,653,811 | 8/1997 | Chan .................................... 118/723 I |
| 5,681,393 | 10/1997 | Takagi ................................ 118/723 IR |
| 5,688,357 | 11/1997 | Hanawa ................................... 156/345 |
| 5,716,451 | 2/1998 | Hama et al. ........................... 118/723 |
| 5,759,280 | 6/1998 | Holland et al. ....................... 118/723 I |
| 5,800,619 | 9/1998 | Holland et al. ....................... 118/723 I |

FOREIGN PATENT DOCUMENTS

| | | |
|---|---|---|
| 0 425 419 | 9/1990 | European Pat. Off. . |
| 0 813 227 | 12/1997 | European Pat. Off. . |
| 8-203695 | 8/1996 | Japan . |

*Primary Examiner*—Randy Gulakowski
*Assistant Examiner*—Allan Olsen
*Attorney, Agent, or Firm*—Burns, Doane, Swecker & Mathis, L.L.P.

[57] ABSTRACT

A method and apparatus for controlling deposit build-up on an interior surface of a dielectric member of a plasma processing chamber. The deposit build-up is controlled by selective ion bombardment of the inner surface by shifting location of a peak voltage amplitude of a voltage standing wave on an antenna such as a flat spiral coil of the plasma processing chamber. A region of high ion bombardment on the interior surface of the dielectric member is displaced by controlling the value of a termination capacitance over a range of values causing regions of low and high ion bombardment to move over the dielectric member in order to effect cleaning thereof.

15 Claims, 5 Drawing Sheets

FIG. 4a
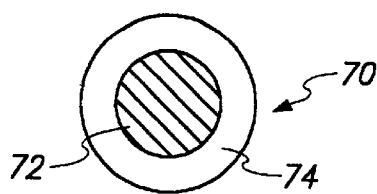
FIG. 4b
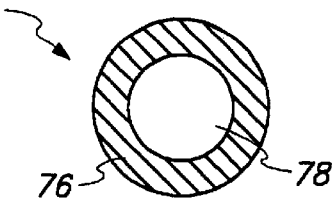
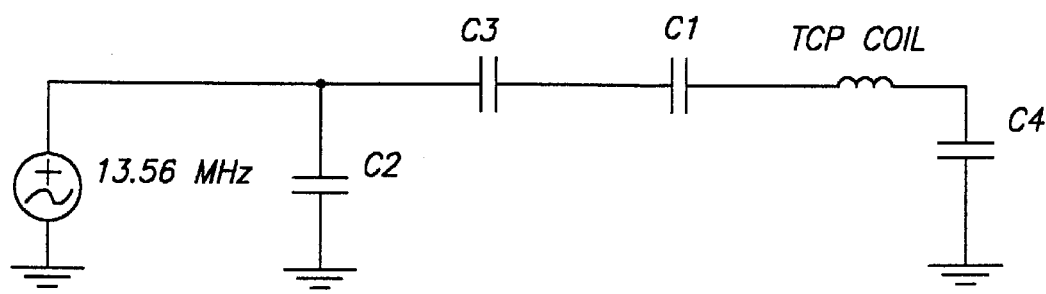
FIG. 5
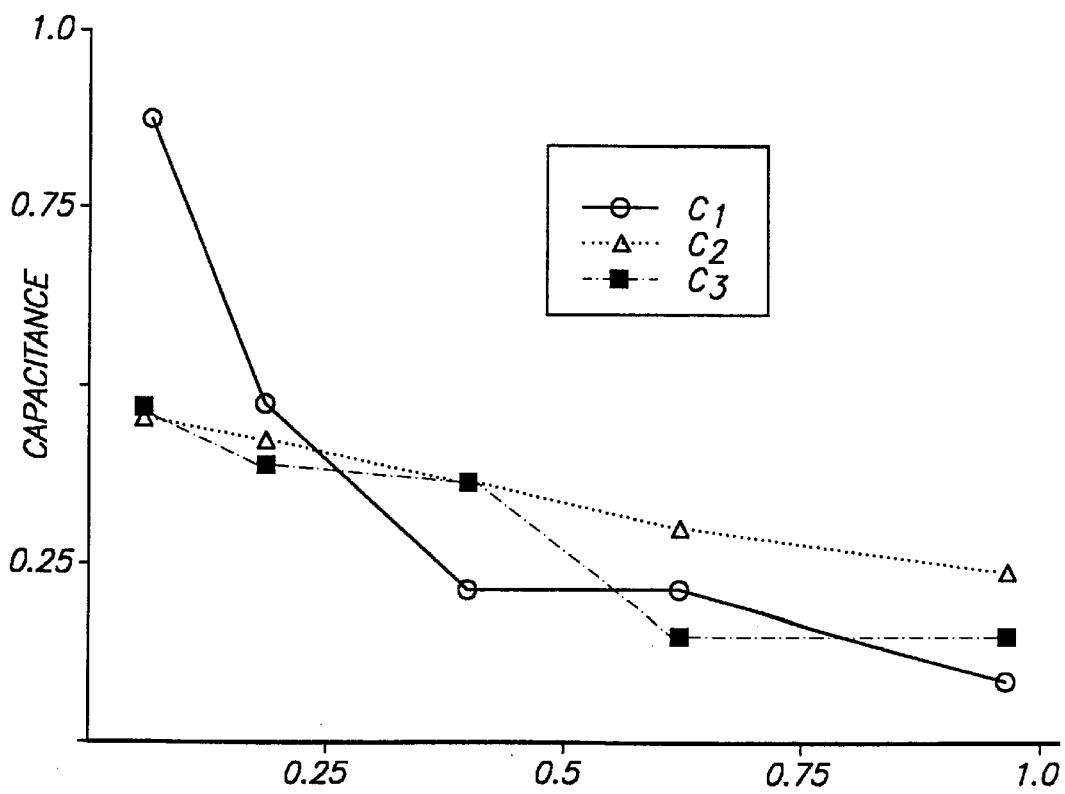
FIG. 6

METHOD AND APPARATUS FOR CONTROL OF DEPOSIT BUILD-UP ON AN INNER SURFACE OF A PLASMA PROCESSING CHAMBER

FIELD OF THE INVENTION

The invention relates to improvements in a plasma reactor and to a method of processing a substrate in the plasma reactor such as by plasma etching an oxide layer on a semiconductor wafer.

BACKGROUND OF THE INVENTION

Vacuum processing chambers are generally used for chemical vapor depositing (CVD) and etching of materials on substrates by supplying process gas to the vacuum chamber and application of an RF field to the gas. Examples of parallel plate, transformer coupled plasma (TCP™, also called ICP), and electron-cyclotron resonance (ECR) reactors are disclosed in commonly owned U.S. Pat. Nos. 4,340,462; 4,948,458; and 5,200,232. The substrates are held in place within the vacuum chamber during processing by substrate holders. Conventional substrate holders include mechanical clamps and electrostatic clamps (ESC). Examples of mechanical clamps and ESC substrate holders are provided in commonly owned U.S. Pat. No. 5,262,029 and commonly owned U.S. application Ser. No. 08/401,524 filed on Mar. 10, 1995. Substrate holders in the form of an electrode can supply radiofrequency (RF) power into the chamber, as disclosed in U.S. Pat. No. 4,579,618.

Plasma reactors wherein an antenna coupled to a radiofrequency (RF) source energizes gas into a plasma state within a process chamber are disclosed in U.S. Pat. Nos. 4,948,458; 5,198,718; 5,241,245; 5,304,279; 5,401,350; 5,531,834; 5,464,476; 5,525,159; 5,529,657; and 5,580,385. In such systems, the antenna is separated from the interior of the process chamber by a dielectric member such as a dielectric window, gas distribution plate, encapsulating layer of epoxy, or the like, and the RF energy is supplied into the chamber through the dielectric member. Such processing systems can be used for a variety of semiconductor processing applications such as etching, deposition, resist stripping, etc.

During an oxide etch of a semiconductor wafer in a plasma reactor, polymer can build up on the exposed surface of the dielectric member. As the polymer buildup deepens the uniformity of processing of the substrate can be affected and/or polymer can then flake off of the dielectric member. If the dielectric member is located directly above the substrate and chuck, polymer particles can fall directly on the substrate or the chuck below. This can ruin the substrate decreasing yield or cause chucking problems. In addition, the process must be stopped and the chamber cleaned. The delay due to the "down-time" required for cleaning also represents a substantial loss in production yield. Therefore, control of the deposition of polymer on the dielectric member is critical for achieving a high yield and maintaining through-put of the substrates in the plasma reactor.

SUMMARY OF THE INVENTION

An object of the present invention is to increase through-put of processed substrates when substrates such as semiconductor wafers are processed continuously in a plasma reactor with a surface of a dielectric member such as a dielectric window or gas distribution plate (GDP) facing the substrate.

It is a further object of the invention to control deposit build-up on an interior surface in a plasma reactor and thereby increase the yield of the produced substrates and reduce down-time need for cleaning of the reactor.

The foregoing and other objects are accomplished by an improved method and apparatus for controlling the voltage standing wave exhibited by an antenna separated from the interior of a plasma reactor by a dielectric member. According to one aspect of the present invention, it has been observed that in the region or regions of high amplitude of the voltage standing wave of the antenna, deposits are cleaned from the dielectric member by ion bombardment. On the other hand, at regions along the antenna where the amplitude of the standing wave voltage is low, deposits will build up a thick, sometimes poorly adherent layer. Therefore according to one embodiment of the present invention, the region of ion bombardment is moved around by displacing the standing voltage wave of the antenna such that dielectric member is "cleaned" or any deposit build-up that does occur is inhibited and more uniform.

According to one exemplary embodiment of the invention, the value of the termination impedance of the antenna is varied to control the location of the high and low voltage amplitudes of the standing wave on the antenna. According to this embodiment of the present invention, the value of a termination capacitor is varied such that regions of low and high ion bombardment move over the dielectric member.

According to an exemplary embodiment, when the termination capacitor is at a high value, a clean central region is formed and deposit build-up occurs in an outer region surrounding the central region. At lower capacitive values, the central region exhibits deposit build-up and the outer region is cleaned by ion bombardment. By controlling ion bombardment of these regions, the uniformity and adherence of the deposit build-up on the dielectric member may be controlled.

According to an exemplary embodiment, the termination capacitor may be varied two or more times, continuously varied or set to a desired value during processing of an individual substrate such as during an oxide etch of a semiconductor (e.g., silicon) wafer in the plasma reactor and/or during a clean cycle following the etching step. For instance, the termination capacitor can be operated at one value during the processing (e.g., during a wafer etch process) and the capacitor can be operated at a different value during a cleaning step (e.g., during an oxygen clean cycle).

BRIEF DESCRIPTION OF THE DRAWINGS

The invention will be described in greater detail with reference to the accompanying drawings in which like elements bear like reference numerals, and wherein:

FIGS. 4a–4b are representations of deposit build-up patterns (shown with cross-hatching) with variation in termination capacitance;

FIG. 5 illustrates an exemplary circuit arrangement for an antenna in the form of the spiral coil shown in FIG. 3;

FIG. 6 illustrates the effect of variations of the $C_4$ value of the circuit shown in FIG. 5 on values of $C_1$, $C_2$ and $C_3$ which minimize reflected power;

DETAILED DESCRIPTION OF THE PREFERRED EMBODIMENTS

The invention provides improvements in reducing particle contamination of substrates such as semiconductor (e.g., silicon, gallium arsenide, etc.) wafers, flat panel display substrates, and the like. In addition, the invention provides uniform and reproducible processing of sequentially processed substrates while allowing extremely long continuous processing runs (e.g., over 100, preferably over 1000 and more preferably over 2000 wafer runs) between shut downs for reactor cleaning.

In plasma etching of substrates, features can be etched into layers of various materials on substrates such as silicon wafers. In such etching processes, a gas distribution plate can be used to control the spacial distribution of gas flow in the volume of the reactor above the plane of the substrate. In the TCP™ 9100™ plasma etching reactor available from LAM Research Incorporated, the gas distribution plate is a circular plate situated directly below the TCP™ window which is also the vacuum sealing surface at the top of the reactor in a plane above and parallel to a semiconductor wafer. The gas distribution plate is sealed using an O-ring to a gas distribution ring located at the periphery of the gas distribution plate. The gas distribution ring feeds gas from a source into the volume defined by the gas distribution plate, an inside surface of a window underlying an antenna in the form of a flat spiral coil supplying RF energy into the reactor, and the gas distribution ring. The gas distribution plate contains an array of holes of a specified diameter which extend through the plate. The spacial distribution of the holes through the gas distribution plate can be varied to optimize etch uniformity of the layers to be etched, e.g., a photoresist layer, a silicon dioxide layer and an underlayer material on the wafer. The cross-sectional shape of the gas distribution plate can be varied to manipulate the distribution of RF power into the plasma in the reactor. The gas distribution plate material must be a dielectric to enable coupling of this RF power through the gas distribution plate into the reactor. Further, it is desirable for the material of the gas distribution plate to be highly resistant to chemical sputter-etching in environments such as oxygen or a hydrofluorocarbon gas plasma in order to avoid breakdown and the resultant particle generation associated therewith.

Figure 1:
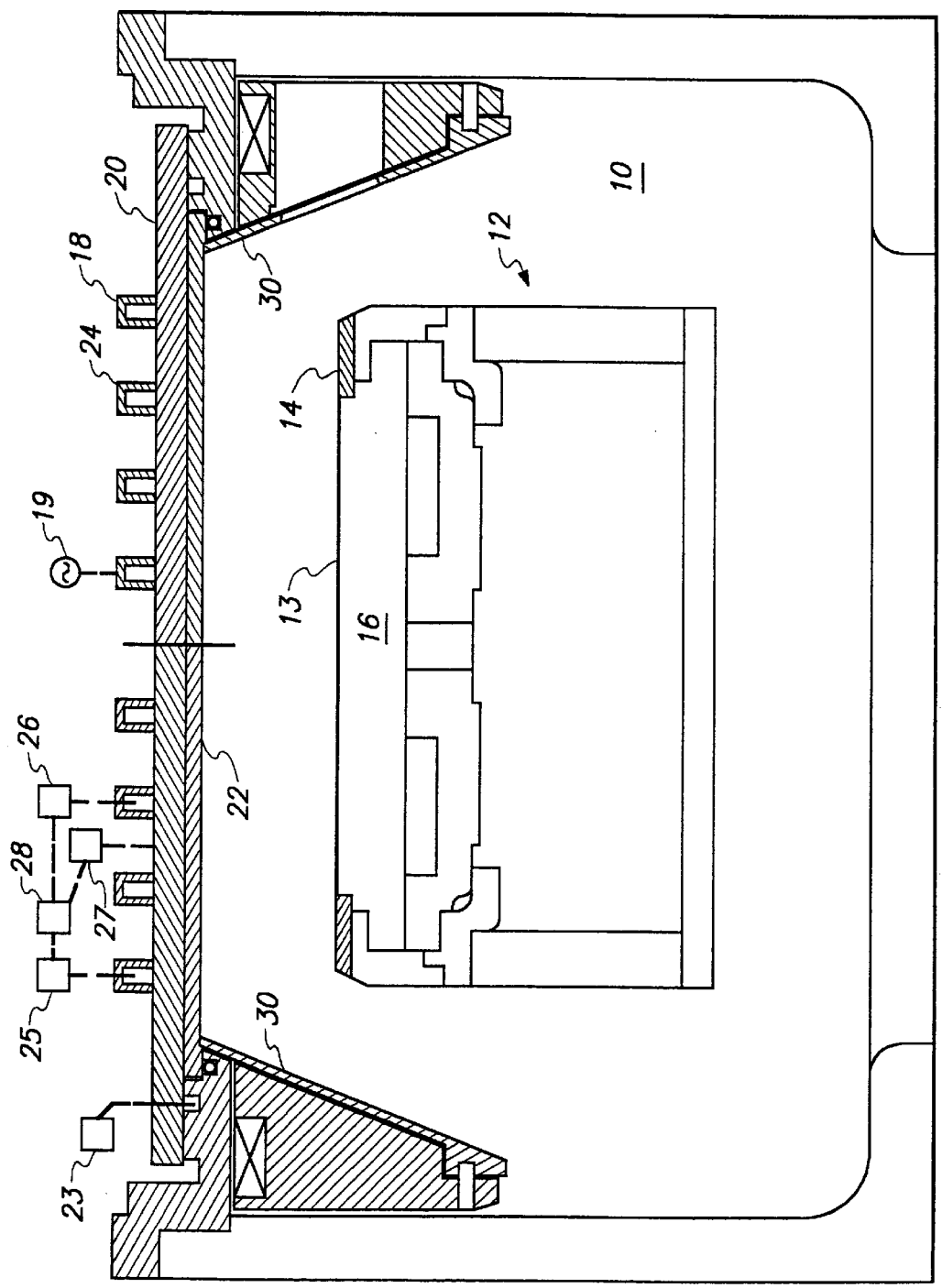
FIG. 1 is a cross sectional view of a vacuum processing chamber having a liner, focus ring and gas distribution plate according to an exemplary embodiment the invention.

A vacuum processing chamber according to one embodiment of the present invention is illustrated in FIG. 1. The vacuum processing chamber 10 includes a substrate holder 12 in the form of a bottom electrode providing an electrostatic clamping force to a substrate 13 as well as an RF bias to a substrate supported thereon and a focus ring 14 for confining plasma in an area above the substrate while it is He backcooled. A source of energy for maintaining a high density (e.g. $10^{11}$–$10^{12}$ ions/cm$^3$) plasma in the chamber such as an antenna 18 in the form of a flat spiral coil powered by a suitable RF source and suitable RF impedance matching circuitry inductively couples RF energy into the chamber 10 so as to provide a high density plasma. The chamber includes suitable vacuum pumping apparatus for maintaining the interior of the chamber at a desired pressure (e.g. below 50 mTorr, typically 1–20 mTorr). A substantially planar dielectric window 20 of uniform thickness is provided between the antenna 18 and the interior of the processing chamber 10 and forms the vacuum wall at the top of the processing chamber 10. A gas distribution plate, commonly called a showerhead 22, is provided beneath the window 20 and includes a plurality of openings such as circular holes (not shown) for delivering process gas supplied by the gas supply 23 to the processing chamber 10. A conical liner 30 extends from the gas distribution plate and surrounds the substrate holder 12. The antenna 18 can be provided with a channel 24 through which a temperature control fluid is passed via inlet and outlet conduits 25,26. However, the antenna 18 and/or window 20 could be cooled by other techniques such as by blowing air over the antenna and window, passing a cooling medium through or in heat transfer contact with the window and/or gas distribution plate, etc.

In operation, a wafer is positioned on the substrate holder 12 and is typically held in place by an electrostatic clamp, a mechanical clamp, or other clamping mechanism when He backcooling is employed. Process gas is then supplied to the vacuum processing chamber 10 by passing the process gas through a gap between the window 20 and the gas distribution plate 22. Suitable gas distribution plate arrangements (i.e., showerhead) arrangements are disclosed in commonly owned U.S. patent application Ser. Nos. 08/509,080; 08/658,258; and 08/658,259, the disclosures of which are hereby incorporated by reference.

Figure 2:
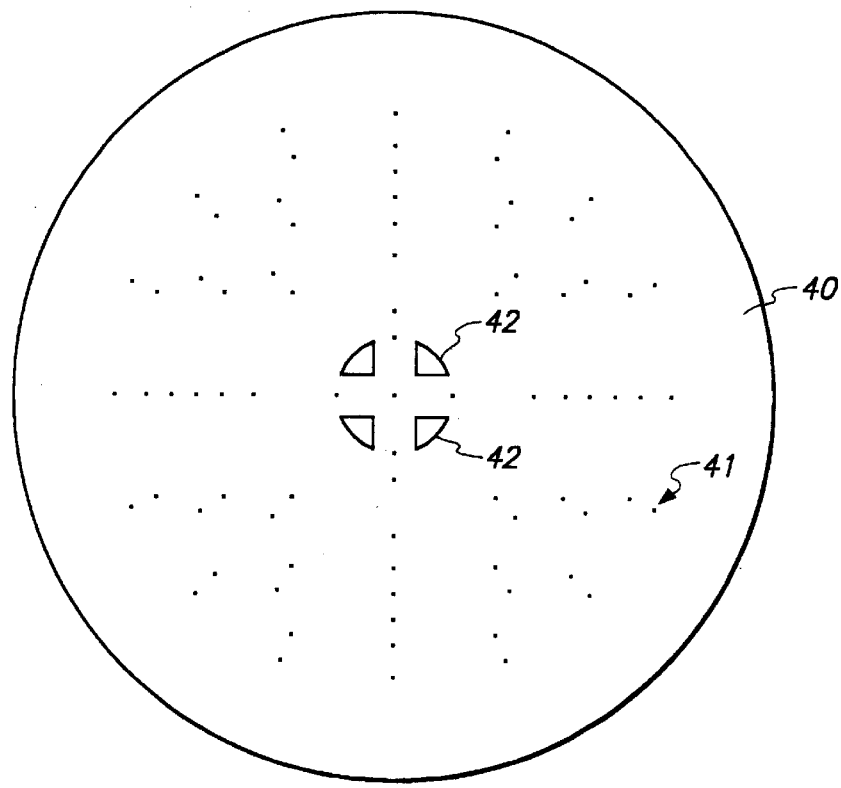
FIG. 2 is a top view of an 89 hole gas distribution plate according to an exemplary embodiment the invention.

The gas distribution plate can have various designs one example of which is shown in FIG. 2. The gas distribution plate 40 shown in FIG. 2 includes eighty-nine holes 41 and four embossments 42 near the center thereof for providing a passage for supply of process gas between the gas distribution plate and the dielectric window. The gas distribution plate, liner and/or focus ring can be mounted in chambers of the types disclosed in commonly owned U.S. patent application Ser. Nos. 08/658,261 and 08/658,262, the disclosures of which are hereby incorporated by reference. A complete description of a process for producing semiconductor substrates for use with the present invention is disclosed in commonly owned U.S. patent application Ser. No. 08/722,371, the disclosure of which is hereby incorporated by reference.

Figure 3:
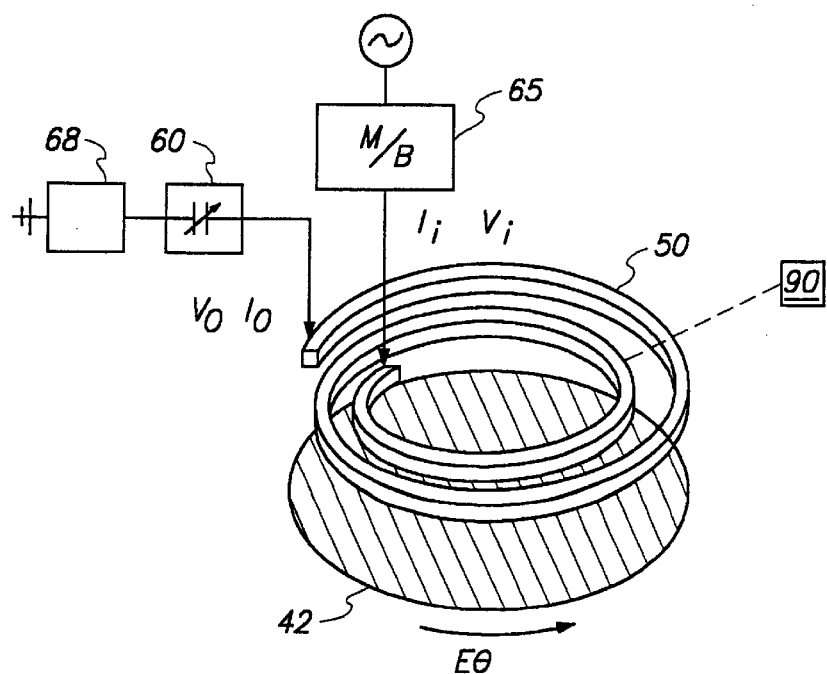
FIG. 3 illustrates an antenna in the form of a flat spiral coil according to an exemplary embodiment of the invention.

Turning to FIG. 3, an illustration of a TCP™ coil 50 is shown positioned above a plasma 42 generated by the coil. The outer end of the coil 50 is connected to a variable terminating capacitor 60 having output voltage and current $V_O$ and $I_O$, respectively. The inner end of the coil is connected to an RF power supply which supplies RF power through matching circuit 65 such that the inner end of the coil has input voltage and current $V_i$ and $I_i$, respectively. Matching circuits, such as 65, are known to those skilled in the art and therefore are not further described herein. As a lossy transmission line, the TCP™ coil 50 exhibits a voltage standing wave that can be displaced along its length by varying the terminating impedance of the coil. In the example shown in FIG. 3 the terminating impedance is provided by capacitor 60. However, it will be apparent to persons skilled in the art that displacement of the voltage standing wave can be achieved by other techniques.

In a region of the coil 50 that exhibits a high voltage standing wave amplitude (i.e., peak voltage) there is a corresponding region of high ion bombardment of the gas distribution plate 40. In the region of high ion bombardment, the gas distribution plate remains relatively free from polymer build-up. In other regions where ion bombardment is low, build-up of polymer can occur. In other words, in the regions of the coil 50 where peak voltage is high, polymer build-up is minimized in adjacent areas on the interior surface of the gas distribution plate.

The location of the highest voltage amplitude of the standing wave can be displaced along the coil 50 by manipulating the terminating impedance. In an exemplary embodiment, capacitor 60 is used to vary the terminating impedance. By varying the value of the capacitance of capacitor 60 the regions of high and low ion bombardment can be moved over the surface of the gas distribution plate 40 to effectuate cleaning of the plate 40.

According to an exemplary embodiment of the invention it was found that when the termination capacitor was set at a low value the dielectric member 70 includes an inner area 72 of polymer build-up and an outer relatively clean area 74, as shown in FIG. 4a. By raising the capacitance of the capacitor 60, the area of polymer build-up can be shifted to an outer area 76 and the previous build-up on the inner area can be reduced by ion bombardment of that area to form a relatively clean inner area 78, as shown in FIG. 4b. According to the invention, the capacitance can be controlled and/or varied to move the clean zones over the inner surface of a dielectric member such as the gas distribution plate in order to inhibit deposit buildup.

The capacitance of variable capacitor 60 can be controlled electromechanically by a control circuit 68, for example. According to this embodiment of the invention, at least two control schemes can be implemented. A first control scheme systematically varies the capacitance of capacitor 60 during processing such as an etching step or oxygen clean step. According to a preferred embodiment the capacitance is changed in the same way for each cycle in order to provide uniform and reproducible processing of sequentially processed substrates. A second control method operates the capacitor 60 at one value during a processing cycle and at a second value during the oxygen clean cycle. Alternatively, in the case where the substrate is smaller in size than the antenna, the capacitance could be set at a value which achieves uniform build-up of deposits over an area of the dielectric member commensurate with that of the substrate. In this case, uniform substrate processing can be achieved followed by an optional cleaning step to remove the deposit build-up.

Figure 7:
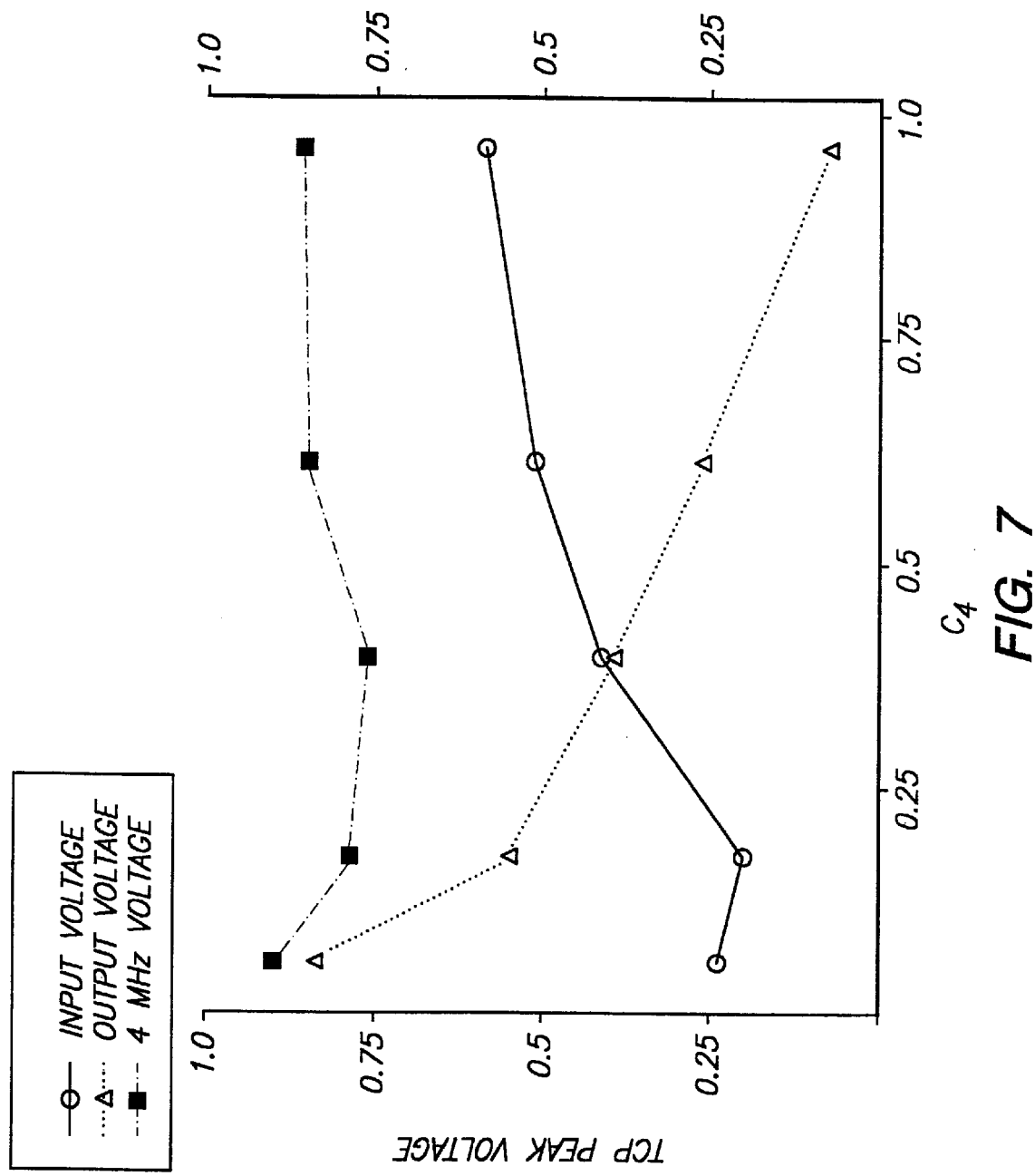
FIG. 7 illustrates the effect of variations of the $C_4$ value on the antenna voltage amplitude and the bottom electrode RF voltage.
Figure 8:
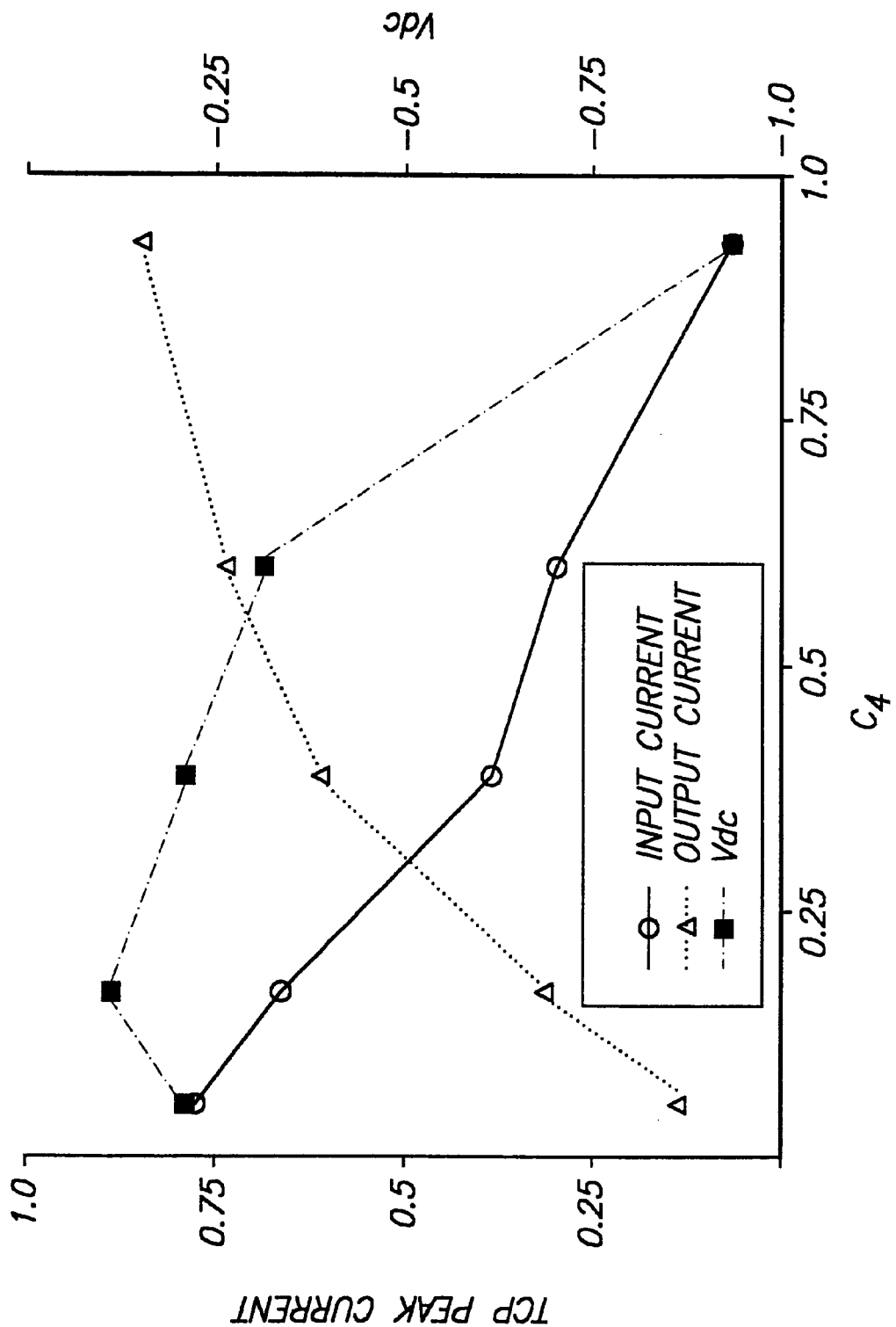
FIG. 8 illustrates the effect of variations of the $C_4$ value on the antenna current amplitude and the bottom electrode RF current.

FIGS. 5–8 illustrate details of a circuit which can be used to drive the TCP™ coil shown in FIG. 1. As shown in FIG. 5, the antenna is in the form of a TCP™ coil supplied with RF power through a circuit arrangement including capacitors $C_1$, $C_2$ and $C_3$ with a termination capacitor $C_4$ connected to an output of the coil. FIG. 6 illustrates the effect of variations of the $C_4$ value (normalized) of the circuit shown in FIG. 5 on normalized values of $C_1$, $C_2$ and $C_3$ which minimize reflected power. For autotuning, $C_2$ and $C_3$ can be servo driven and $C_3$ can be manually adjusted. FIG. 7 illustrates the effect of variations of the $C_4$ value (normalized) on the antenna peak voltage (normalized) and the bottom electrode RF voltage (normalized). FIG. 8 illustrates the effect of variations of the $C_4$ value (normalized) on the antenna peak current (normalized) and the bottom electrode RF current (normalized). The optimized values of $C_1$, $C_2$, $C_3$ and $C_4$ will depend on many factors such as the type of substrate to be processed, the type of antenna, the type of process to be carried out, etc.

The bottom electrode is used to apply an RF bias to the substrate being processed. For example, it is conventional to apply at 4 MHz RF current to the bottom electrode. The RF voltage and current on the bottom electrode are determined by the reactor impedance with a plasma established in the reactor. FIG. 7 shows that the RF voltage on the bottom electrode is a function of the $C_4$ value. The changes in RF voltage on the bottom electrode does not have a major effect on processing of a substrate. As shown in FIG. 8, the dc voltage (i.e., RF bias) on the bottom electrode becomes more negative as the plasma generation is shifted towards chamber walls for higher $C_4$ values.

It is noted that the embodiments described above have been provided for illustrative purposes only and that other embodiments will suggest themselves to those skilled in the art. For example, antennas other than the flat spiral coil 50 described above may be used to control the ion bombardment of the gas distribution plate. For instance, more than one antenna can be used and/or the antenna can have non-planar configurations or have a non-spiral shape. If a spiral coil is used, the number of turns thereof can be selected based on the size of the substrate to be processed. In addition, while the invention has been described with respect to controlling the capacitance of capacitor 60, other techniques could be used to control the ion bombardment on the gas distribution plate. For example, inductors could be used to terminate coil 50 and provide a variable impedance in accordance with the present invention. Also, in addition to or in place of varying the termination impedance, the standing wave could be modified by electrical components connected to other portions of the coil (e.g., optional circuit component 90 as shown in dotted lines in FIG. 3).

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of reducing deposit build-up on an interior surface of a plasma processing chamber wherein substrates are processed, the plasma processing chamber including an antenna and a dielectric member separating the antenna from an interior of the plasma processing chamber, comprising steps of:

(a) generating plasma in the interior of the plasma processing chamber by applying radiofrequency current to the antenna, a portion of the radiofrequency current being capacitively coupled to the plasma by a voltage standing wave; and (b) controlling deposit build-up on the interior surface of the dielectric member by shifting a location of a maximum voltage amplitude of the voltage standing wave along the antenna such that an amount of ion bombardment on the interior surface of the dielectric member is varied and uniform substrate processing during sequential processing of substrates in the plasma processing chamber can be obtained.

2. The method according to claim 1, wherein the controlling step is carried out while processing a substrate in the plasma processing chamber.

3. The method according to claim 2, wherein the voltage standing wave is shifted on the antenna by varying a termination impedance of the antenna.

4. The method according to claim 3, wherein the termination impedance is controlled by varying capacitance of a termination capacitor connected to the antenna.

5. The method according to claim 4, wherein the capacitance is maintained at a value which causes less bombardment on a central region of the interior surface than on an outer region surrounding the inner region.

6. The method according to claim 4, wherein the capacitance is raised from a first capacitance to a second capacitance, the second capacitance causing greater ion bombardment on an inner region of the interior surface than on an outer region of the interior surface and the first capacitance causing greater ion bombardment on the outer region than on the inner region.

7. The method of claim 4, wherein the capacitance is varied during etching of a single substrate, during an oxygen clean cycle or combination thereof.

8. The method of claim 4, wherein the capacitance is maintained at a first value during processing of a substrate and at a second value during a cleaning step while the substrate remains in the plasma processing chamber.

9. The method of claim 4, wherein the capacitance is at a first value during etching of a substrate and at a second value during an oxygen clean cycle, the second value being higher than the first value.

10. A method of processing a substrate in a plasma processing chamber having an antenna separated from an interior of the plasma processing chamber by a dielectric member, comprising steps of:

(a) supplying process gas into the interior of the plasma processing chamber;

(b) energizing the process gas into a plasma state by supplying radiofrequency energy to the antenna;

(c) the radiofrequency energy having a first voltage amplitude at a first portion of the antenna and a second voltage amplitude at a second portion of the antenna, the first voltage amplitude being higher than the second voltage amplitude;

(d) processing a substrate in the interior of the plasma processing chamber by contacting an exposed surface of the substrate with the plasma, the processing producing deposits which are more heavily deposited on a first portion of an interior surface of the dielectric member than on a second portion of the interior surface;

(e) shifting locations of the first and second peak amplitudes on the antenna such that the deposits are more heavily deposited on the second portion of the interior surface while reducing the deposits on the first portion of the interior surface; and (f) removing the substrate from the plasma processing chamber.

11. The method according to claim 10, wherein the dielectric member comprises a gas distribution member having an exposed surface facing the substrate, the gas distribution member including gas distribution holes through which the process gas flows into a reaction zone adjacent the substrate, the process gas flowing through the gas distribution holes into the plasma processing chamber and being maintained in a plasma state adjacent the exposed surface of the gas distribution member by inductively coupling radiofrequency energy from the antenna through the gas distribution member.

12. The method according to claim 10, further comprising processing additional substrates in the plasma processing chamber by repeating steps (a–f).

13. The method according to claim 10, wherein during the processing step the antenna comprises a substantially planar spiral coil which energizes the process gas into the plasma state and the process gas comprises one or more halogen containing gases which etch the substrate during the processing step.

14. The method according to claim 10, wherein during the processing step the plasma comprises a high density plasma and the substrates are processed by etching a layer on the substrates with the high density plasma while supplying a radiofrequency bias to the substrates.

15. The method according to claim 10, wherein the locations of the first and second peak amplitudes are shifted by varying a termination impedance on the antenna.

* * * * *